United States Patent [19]

Takeuchi

[11] Patent Number: 5,493,238
[45] Date of Patent: Feb. 20, 1996

[54] PARAMETER EXTRACTION APPARATUS USING MISFET DEVICES OF DIFFERENT GATE LENGTHS

[75] Inventor: Kiyoshi Takeuchi, Tokyo, Japan

[73] Assignee: NEC Corporation, Tokyo, Japan

[21] Appl. No.: 233,828

[22] Filed: Apr. 26, 1994

[51] Int. Cl.$^6$ .................................................. G01R 1/04
[52] U.S. Cl. ............................................................ 324/769
[58] Field of Search ..................................... 324/769, 73.1

[56] References Cited

U.S. PATENT DOCUMENTS 5,233,291  8/1993  Kouno et al. .

Primary Examiner—Kenneth A. Wieder
Assistant Examiner—Barry C. Bowser
Attorney, Agent, or Firm—Young & Thompson

[57] ABSTRACT

In a device parameter extracting apparatus, a set of drain currents $I_D(i,j)$ is measured from each of a plurality of MISFET devices of different gate lengths $L(i)$ by successively applying gate voltages $V_G(i,j)$ to each of the MISFET devices for a predetermined drain voltage, where i identifies each of the MISFET devices and j is an integer. A set of drain currents $I_D(i,k)$ is interpolated from the measured drain currents $I_D(i,j)$ such that the interpolated drain currents correspond respectively to predetermined ones of voltage differences $V_G(i,j)-V_{TH}(i)$, where k is an integer and $V_{TH}(i)$ is a threshold voltage of each of the MISFET devices. A set of regression lines $R(k)=a(k)L(i)+b(k)$ is derived in a coordinate space from a set of relationships between $V(k)/I_D(i,k)$ and the gate lengths $L(i)$ of the devices, where $a(k)$ and $b(k)$ are constants, where $V(k)$ represents the predetermined ones of voltage differences. From the constants $a(k)$ and $b(k)$ is derived a coordinate point of the space which corresponds to an intersection of the regression lines.

7 Claims, 6 Drawing Sheets

PARAMETER EXTRACTION APPARATUS USING MISFET DEVICES OF DIFFERENT GATE LENGTHS

BACKGROUND OF THE INVENTION

1. Field of the Invention

The present invention relates to an apparatus for extracting device parameters from semiconductor devices.

2. Description of the Related Art

An electronic circuit simulation is made by extracting operating parameters from a device model so as to imitate their real-life behaviors. The drain current of a device model using MISFET's (metal-insulator-semiconductor field-effect transistor) is given by the relation:

$$I_D = f(p_1, \ldots, p_N; V_D, V_G, V_{SUB}) \tag{1}$$

where $V_D$, $V_G$ and $V_{SUB}$ are the drain voltage, gate voltage and substrate voltage, respectively, using the source terminal as a reference potential, and $p_1, \ldots, p_N$ are physical values such as carrier mobility, saturation speed, gate length, channel width and so forth. Of these, directly measurable parameters such as gate length are given in advance of the simulation. In the case of high precision models, several tens of parameters are extracted. If the drain current of a measured device is given by:

$$I_D = g(V_D, V_G, V_{SUB}) \tag{2}$$

the usual parameter extraction involves selecting parameters $p_1 \sim p_N$ such that they substantially correspond to real-life values in the full range of the voltages $V_D$, $V_G$ and $V_{SUB}$. Specifically, the parameters $p_1 \sim p_N$ are selected so that square error $E = \Sigma(f_i - g_i)^2$ has a minimum value (where $f_i$ and $g_i$ are the i-th measured voltages of Equations (1) and (2), respectively), using an iterative method of programmed algorithm by tentatively giving initial values for $p_1 \sim p_N$ and recursively updating the parameters until the size of changes becomes insignificant. However, the extracted parameters often deviate largely from the values which can be expected. For example, if a set of parameters is extracted from a device model of gate length $L_1$, a change of gate length to $L_2$ would result in a complete loss of agreement with the performance of an actual device of gate length $L_2$. This arises from the fact that, even though the operating characteristics of a device model do not perfectly fit to the real-life characteristics, a parameter extraction has been performed without taking into account their subtle differences.

To alleviate this discrepancy problem, some important parameters are measured separately. One example is to use a MISFET model having a relatively large gate length L and a relatively large channel width W and measure the carrier mobility $\mu_{EFF}$ according to the following relation:

$$I_D = (W/L) \mu_{EFF} C_{ox} (V_G - V_{TH}) V_D \tag{3}$$

where $V_{TH}$ is the threshold voltage and $C_{ox}$ is the capacitance of the gate oxide film per unit area. Since Equation (3) can be precisely established if $V_D \ll V_G - V_{TH}$, measurements made under appropriate conditions allow the parameter $\mu_{EFF}$ to be determined independently of other parameters. Another example is the derivation of an offset value $\Delta L = L - L_{EFF}$ (where $L_{EFF}$ is the effective channel length) and the derivation of a parasitic resistance $R_{EX}$ between source and drain, as disclosed in Japanese Patent Publication (Tokkaisho) 54-26667, by measuring source-drain resistances of several device models having particular gate lengths by applying low drain voltages.

Precise measurement of the parameters $\Delta L$ and $R_{EX}$ significantly alleviates the discrepancy problem, particularly for low drain bias conditions ($V_D \ll V_G - V_{TH}$, so called 'linear region'). However, the device characteristics under the high drain bias conditions (saturation region), which are usually more important than the linear region for digital applications, are still difficult for the model to correctly reproduce. This is due to the lack of accurate data on the distance between the source and the pinch-off point of the device. The pinch-off point is a point beyond which the carrier enters a pinch-off region where it is pulled off to the drain by a high intensity field. As a result, the drain current of a MISFET in the saturation region is determined by the distance between the source and the pinch-off point, rather than the source-to-drain distance of the device, which is called 'effective channel length'. It is known that the effective channel length is not equal to the gate length and the difference between them is of a constant value that can be universally applied to all MISFET devices fabricated by a common manufacturing process. However, no methods have hitherto been available to precisely determine the universal difference value between the gate length and the source-to-pinch-off point distance.

SUMMARY OF THE INVENTION

Therefore, it is an object of the present invention to provide a device parameter extraction apparatus for precisely determining the universal difference value of MISFET devices between the gate length and the source-to-pinch-off point distance.

According to the present invention, there is provided a device parameter extracting apparatus in which a set of drain currents $I_D(i,j)$ is measured from each of a plurality of MISFET devices of different gate lengths L(i) by successively applying gate voltages $V_G(i,j)$ to each of the MISFET devices for a predetermined drain voltage, where i identifies each of the MISFET devices and j is an integer. A set of drain currents $I_D(i,k)$ is interpolated from the measured drain currents $I_D(i,j)$ such that the interpolated drain currents correspond respectively to predetermined ones of voltage differences $V_G(i,j) - V_{TH}(i)$, where k is an integer and $V_{TH}(i)$ is a threshold gate voltage of each of the MISFET devices. A set of regression lines $R(k) = a(k)L(i) + b(k)$ is derived in a coordinate space from a set of relationships between $R = V(k)/I_D(i,k)$ and the gate lengths L(i) of the devices, where a(k) and b(k) are constants, where V(k) represents the predetermined ones of voltage differences. From the constants a(k) and b(k) is derived a coordinate point of the space which corresponds to an intersection of the regression lines.

BRIEF DESCRIPTION OF THE DRAWINGS

The present invention will be described in further detail with reference to the accompanying drawings, in which.

DETAILED DESCRIPTION

Figure 1:
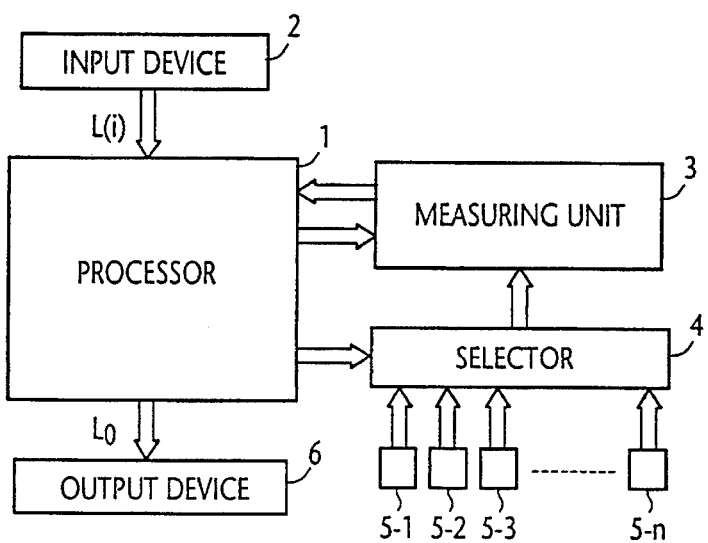
FIG. 1 is a schematic block diagram of a device parameter extraction apparatus of the present invention.

The simulation apparatus of this invention as shown in FIG. 1 comprises a processor 1, an input device 2, a measuring unit 3, and a selector 4 which is responsive to a select command signal from the processor 1 for coupling to the measuring unit 3 one of MISFET devices 5-1~5-n. Each MISFET device has a particular gate length and a channel width of 10 μm and a gate-oxide film thickness of 10 nanometers. The gate length of each MISFET is determined precisely in known manner and supplied through the input device 2 to the processor and stored in a memory.

The measuring unit 3 responds to a command signal from the processor by measuring specified parameters of the selected device. The processor reads and processes the measured parameters to determine the universal difference $L_0$ between gate length and effective channel length in a manner as will be described. An output device 6 is connected to the processor to display or record the difference value $L_0$.

Figure 2:
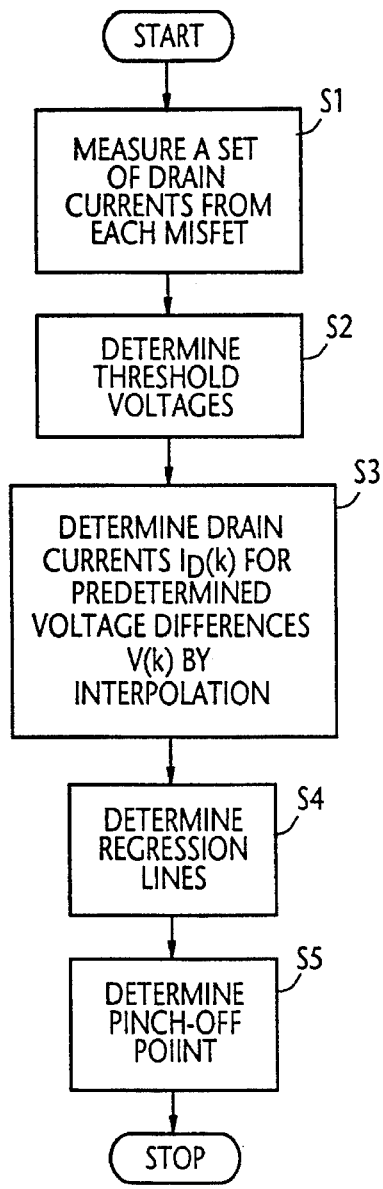
FIG. 2 is a flowchart showing a general sequence of operations of the present invention.

Processor 1 is a personal computer or a workstation loaded with a program which is divided into five subroutines S1, S2, S3, S4 and S5 as shown in FIG. 2. The first subroutine S1 instructs the measuring unit to measure a set of drain currents $I_D(i,j)$ by applying gate voltages $V_G(i,j)$, where j=1 to m. The second subroutine S2 extracts threshold gate voltages $V_{TH}(i)$ from all devices 5-1 to 5-n. The subroutine S3 uses a linear interpolation technique to derive a set of drain currents $I_D(k)$ which would be generated for a set of predetermined voltage differences $V(k)=V_G-V_{TH}$. The subroutine S4 produces regression lines using the interpolated drain currents and the gate length values of the MISFET devices, and subroutine S5 finally derives from the regression lines the universal difference value $L_0$ between gate length L(i) and source-to-pinch-off point distance Ls(i).

Figure 3A:
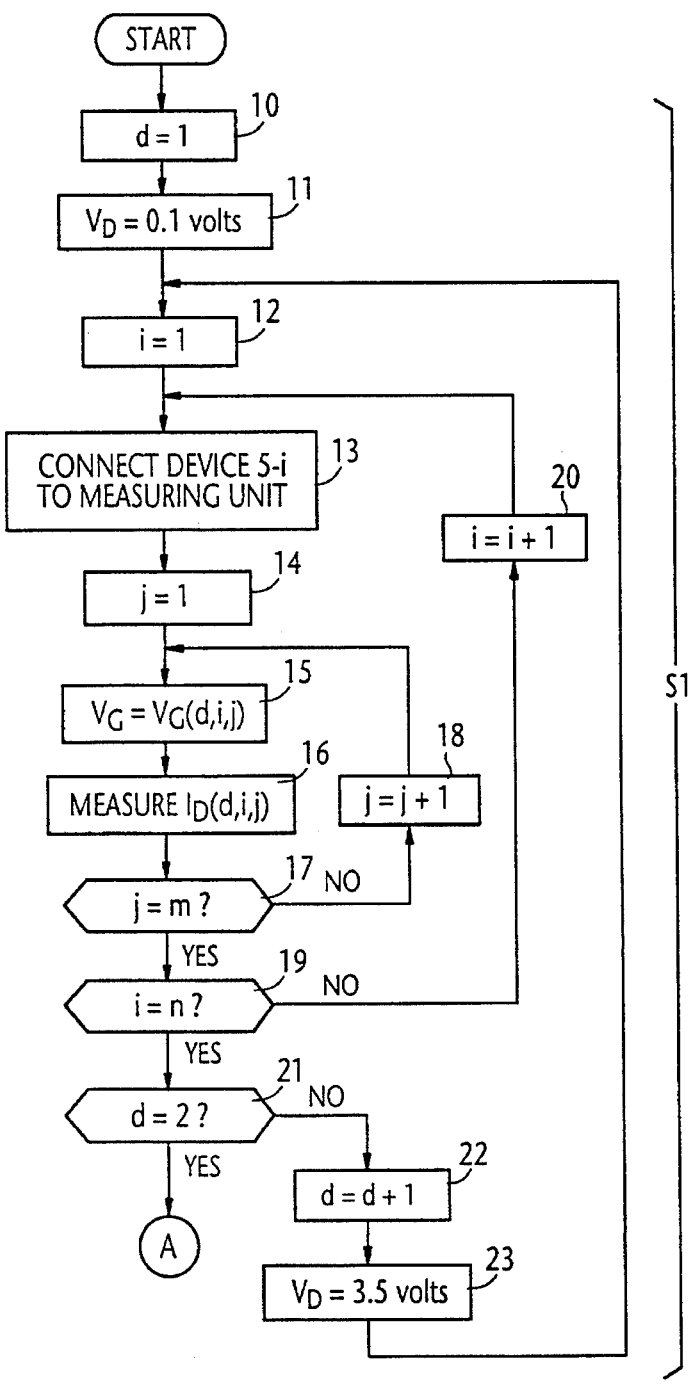
FIGS. 3A to 3D are flowcharts showing details of the operations of the present invention.

In FIG. 3A, subroutine S1 starts with step 10 to set a drain voltage index d to 1. At step 11, a control signal is applied to the measuring unit 3 so that the latter sets the drain voltage $V_D$ to be applied to a device under test to 0.1 volts. Exit then is to step 12 to set a device index i to 1 and a select command signal is applied to selector 4 (step 13) to couple the device 5-i to the measuring unit 3. At step 14, a measuring point index j is set to 1. Control proceeds to step 15 to supply a command signal to the measuring unit 3 to cause it to apply a gate voltage $V_G(d,i,j)$ to the selected MISFET 5-i and goes to step 16 to obtain a drain current $I_D(d,i,j)$. Exit then is to decision step 17 to check to see if J=m. If not, index j is incremented by one at step 18 and control returns to step 15 to repeat steps 15 and 16 on subsequent measuring points until the measuring point j becomes equal to m, thus producing a set of drain currents $I_D(d,i,1)$ through $I_D(d,i,m)$ for a device 5-i.

In a practical embodiment, gate voltage $V_G(i,j)$ is varied with an increment of 0.2 volts in a range between 0 and 5 volts, while maintaining the drain voltage constant. Control now proceeds to decision step 19 to check for equality i=n. If i is not equal to n, device index i is incremented by one at step 20 and control returns to step 13 to repeat the above procedure on subsequent devices until i becomes equal to n, whereupon it proceeds to decision step 21 to check for equality d=2. If d is not equal to 2, the drain voltage index d is incremented by one at step 22 and a control signal is applied to the measuring unit 3 to change the drain voltage to 3.5 volts (step 23), and control returns to step 12.

In this manner, a first set of $I_D(1,i,j)$ and $V_G(1,i,j)$ is obtained for each of the MISFET devices 5-1~5-n for $V_D$=0.1 volts and a second set of $I_D(2,i,j)$ and $V_G(2,i,j)$ is obtained for each MISFET for $V_D$=3.5 volts. Using the first set of $I_D(1,i,j)$ and $V_G(1,i,j)$ data, a plurality of threshold voltages $V_{TH}(i)$ will be obtained respectively for MISFET's 5-1~5-n by the subroutine S2 as follows.

Figure 3B:
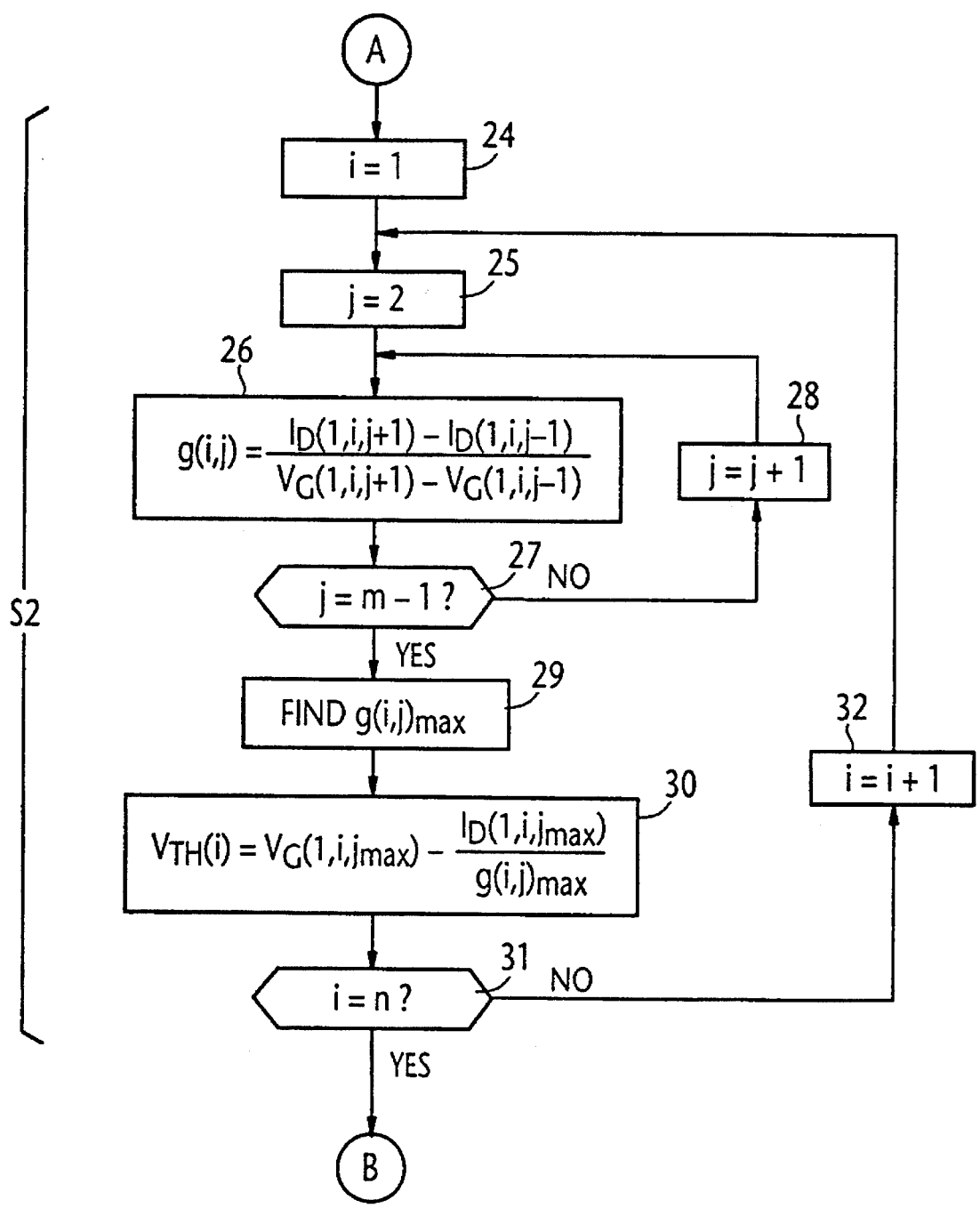

In FIG. 3B, the subroutine S2 begins by setting the device index i to 1 at step 24 and setting the measuring point index j to 2 at step 25. Exit then is to step 26 to calculate the following Equation:

$$g(i,j) = \frac{I_D(1,i,j+1) - I_D(1,i,j-1)}{V_G(1,i,j+1) - V_G(1,i,j-1)} \quad (4)$$

Equation (4) represents the gradient of the $I_D$ versus $V_G$ relationship for device 5-i. Control exits to step 27 to check to see if j=m−1. If the answer is negative, index j is incremented by one at step 28 and control returns to step 26. Steps 26, 27 and 28 are repeated to calculate Equation (4) at successive measuring points until j becomes equal to m−1. The threshold voltage of a MISFET is defined as corresponding to a gate voltage where a tangent line extending from a maximum gradient point of the $I_D/V_G$ curve intersects the zero drain current line.

Therefore, control proceeds to step 29 to find g(i,j) having a maximum value and sets the maximum g(i,j) as $g(i,j)_{max}$. The following Equation (5) is then calculated at step 30 to determine a threshold voltage $V_{TH}(i)$ for the device 5-i.

$$V_{TH}(i) = V_G(1,i,j_{max}) - \frac{I_D(1,i,j_{max})}{g(i,j)_{max}} \quad (5)$$

where $j_{max}$ is the index j corresponding to g(i,j) having the maximum value. Control exits to decision step 31 to determine whether device index i equals n. If not, index i is incremented by one at step 32 and control returns to step 25 to repeat the above process on subsequent devices so that respective threshold voltages $V_{TH}$ are obtained for all MISFET devices.

The program execution now enters the interpolation subroutine S3 to determine a set of drain currents $I_D(i,k)$ which correspond to those of voltage differences $V_G(i,j)-V_{TH}(i)$ which are respectively equal to predetermined voltages V(k). Note that in subroutine S3, data obtained by subroutine S1 with $V_D$=3.5 volts are used.

Figure 3C:
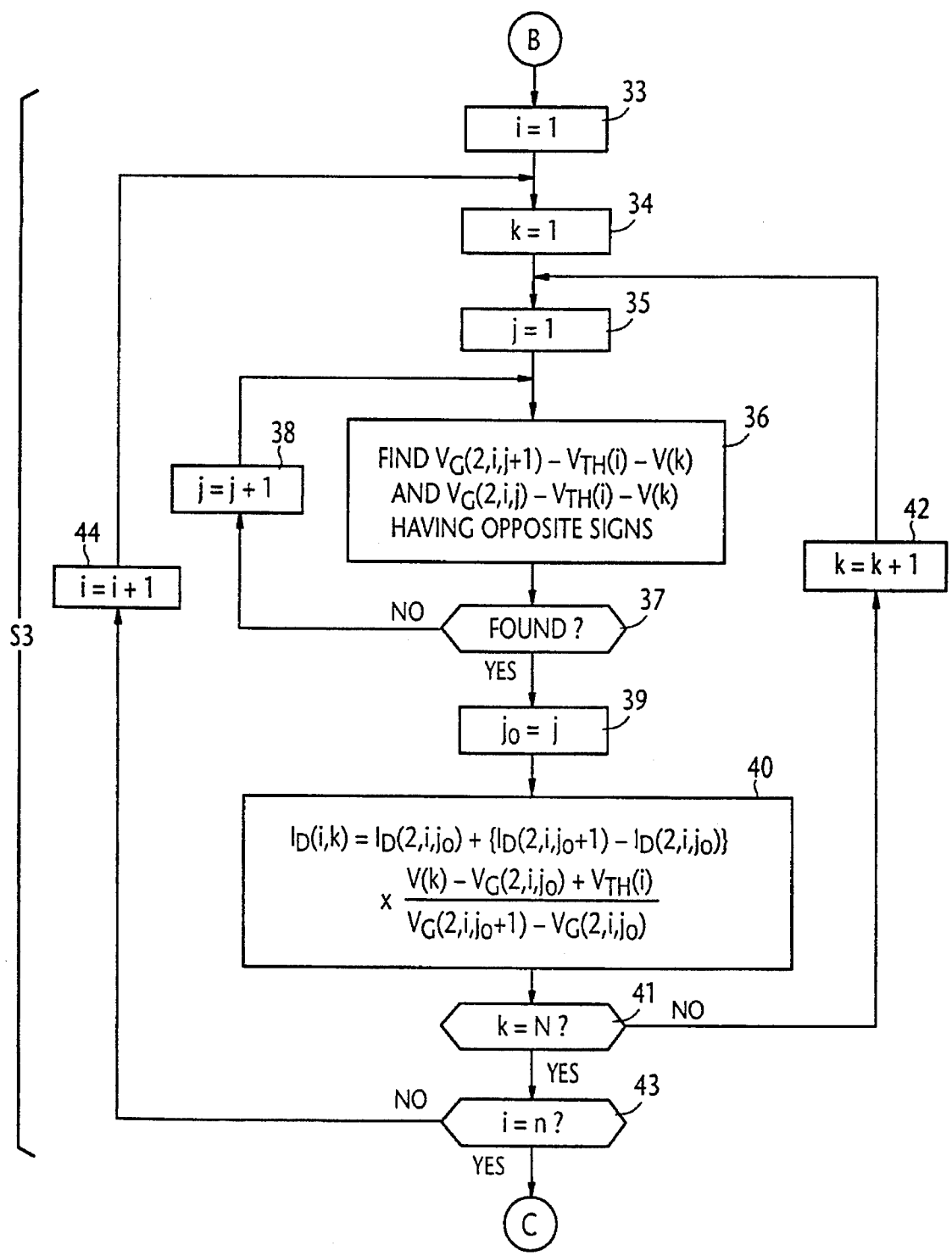

In FIG. 3C, subroutine S3 starts by setting indices i, k and j successively to 1 at steps 33, 34 and 35. At step 36, $V_G(2,i,j+1)-V_{TH}(i)-V(k)$ and $V_G(2,i,j)-V_{TH}(i)-V(k)$ are calculated and a search is made through the calculated values for a pair of those having opposite signs. Steps 36, 37 and 38 are repeated until a pair of values having opposite signs are found at step 37. Control advances to step 39 to set the index j of the opposite signs to $j_o$. The following Equation is calculated at step 40 to derive a drain current of linearly interpolated value:

$$I_D(i,k) = I_D(2,i,j_o) + \{I_D(2, i,j_o + 1) - I_D(2,i,j_o)\} \times \quad (6)$$

$$\frac{V(k) - V_G(2,i,j_o) + V_{TH}(i)}{V_G(2,i,j_o + 1) - V_G(2,i,j_o)}$$

Equation (6) is repeatedly calculated by repeating steps 35 to 42 by incrementing index j by one until k=N is detected at step 41. Exit then is to step 43 to check for equality i=n. If not, index i is incremented by one at step 44 and control returns to step 34 to repeat the process on the rest of the MISFET devices to thereby produce drain currents $I_D(1,k)$ to $I_D(n,k)$ where k=1 to N. In a practical aspect, V(k) is successively incremented from 1.0 to 3.0 volts at increments of 0.5 volts.

The program execution now enters subroutine S4 to derive regression lines R(k)=a(k)L(i)+b(k) and deriving the constants a(k) and b(k) using the LMS (least mean square) algorithm, where $R=(V_G-V_{TH})/I_D$ and L(i) represents the gate length of each MISFET device 5-i.

Figure 3D:
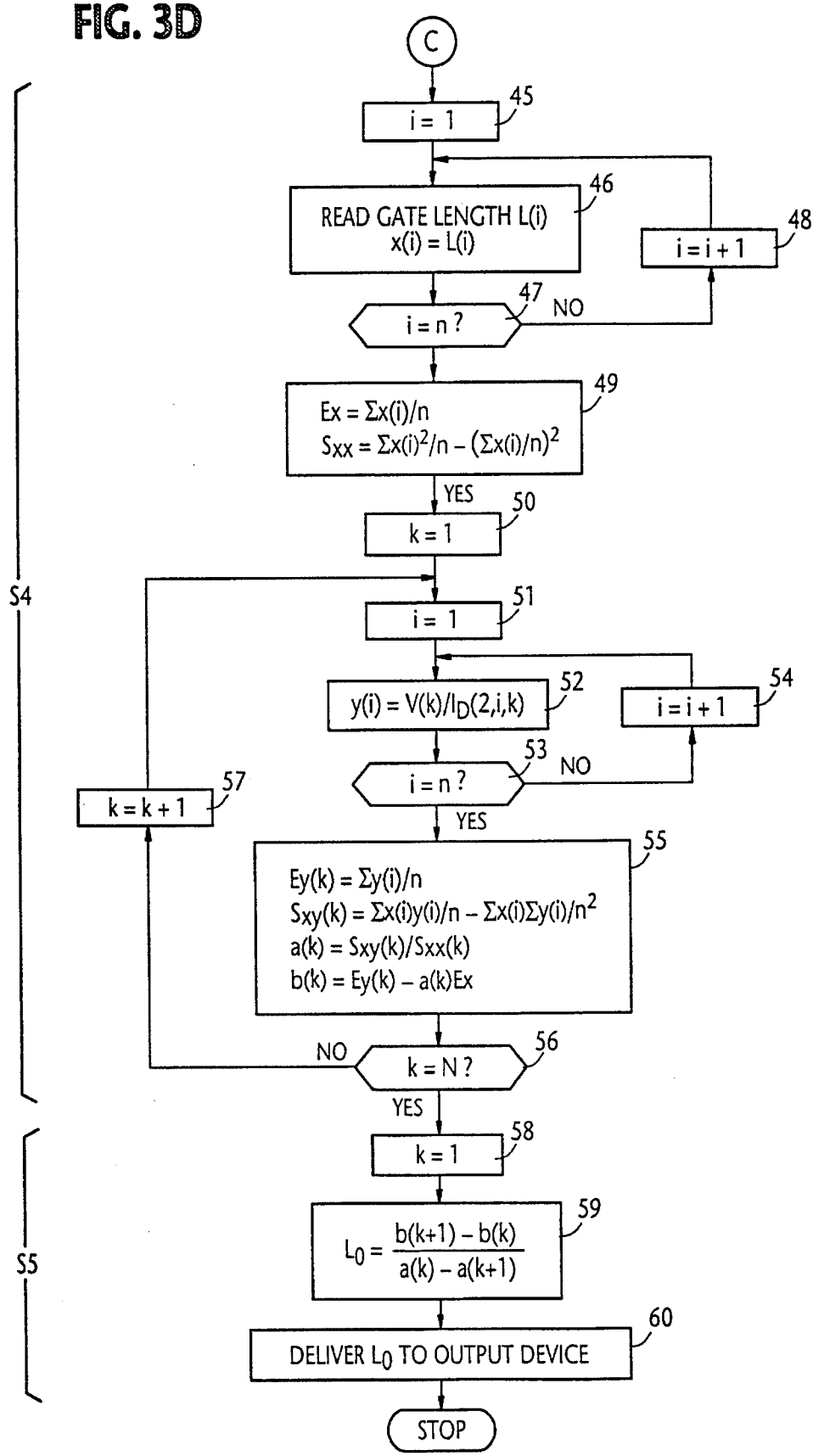

In FIG. 3D, the subroutine S4 begins with step 45 to set index to 1. Gate length data L(i), which has been entered through input device 2 for device 5-i, is read from memory and x(i) is set equal to L(i) at step 46. Step 46 is repeated until index i equals n at step 47 by successively incrementing it at step 48. Control branches at step 47 to step 49 to calculate the following Equations:

$$Ex = \Sigma x(i)/n \quad (7)$$

$$S_{xx} = \Sigma x(i)2/n - (\Sigma x(i)/n)^2 \quad (8)$$

where, x(i)=L(i), Σ represents summation from i=1 to i=n. At step 48, index i is checked for equality to n. If the answer is negative, index i is incremented by one at step 49 and control returns to step 46. If the answer is affirmative at step 48, control branches to step 50 and then to step 51 to successively set indices k and i to 1. At step 52, the following Equation is calculated:

$$y(i) = V(k)/I_D(2,i,k) \quad (9)$$

The computation of Equation (9) at step 52 is repeated n times for respective devices by checking for equality of index i to n at step 53 and incrementing it by one at step 54. Control then exits to step 55 to perform the following computations:

$$Ey(k) = \Sigma y(i)/n \quad (10)$$

$$S_{xy}(k) = \Sigma x(i)y(i)/n - \Sigma y(i)/n^2 \quad (11)$$

Using the results of Equations (10) and (11), constants a(k) and b(k) are obtained as follows:

$$a(k) = S_{xy}(k)/S_{xx}(k) \quad (12)$$

$$b(k) = Ey(k) - a(k)Ex \quad (13)$$

Steps 51 to 55 are repeated until k=N by checking equality at step 56 and incrementing k at step 57, thereby producing a set of constants a(1) to a(N) and a set of constants b(1) to b(N).

Figure 4:
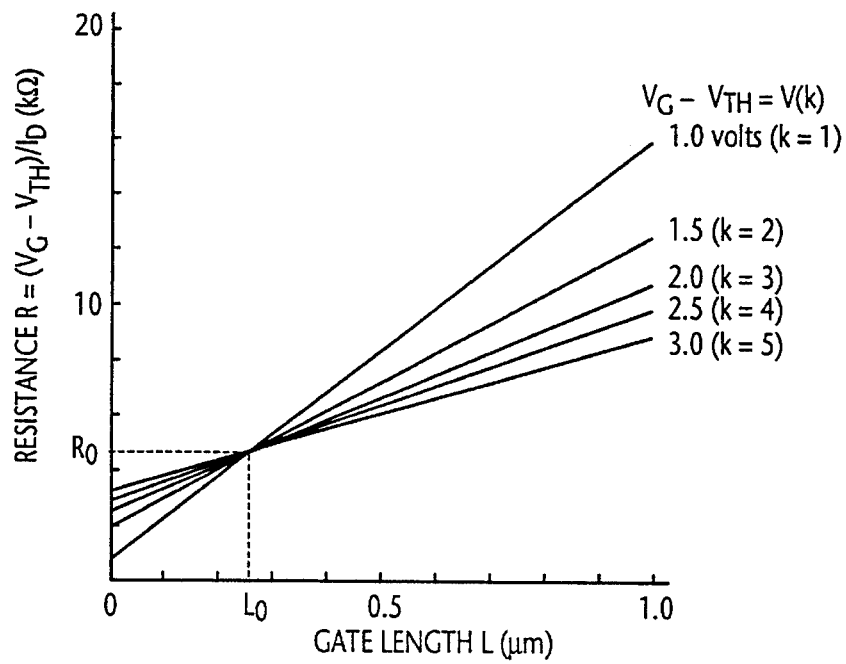
FIG. 4 is a plot of regression lines in a coordinate plane with resistance and gate length respectively indicated on the ordinate and abscissa of the coordinate plane.

As shown in FIG. 4, regression lines are represented by the relation R=aL+b for predetermined voltage differences $V_G-V_{TH}(=V(k))$ by varying V(k) from 1.0 volts to 3.0 volts at intervals of 0.5-volts corresponding to k=1 to k=5, respectively.

The program execution now enters the final subroutine S5 in which the measuring point index k is first set to 1 at step 58 and a length $L_0$ from the origin of the regression line diagram of FIG. 4 is derived at step 59 from a successive pair of the regression lines using the following Equation:

$$L_0 = \frac{b(k+1) - b(k)}{a(k) - a(k+1)} \quad (14)$$

Control proceeds to step 60 to deliver the result of Equation (14) to the output device 6.

Figure 5:
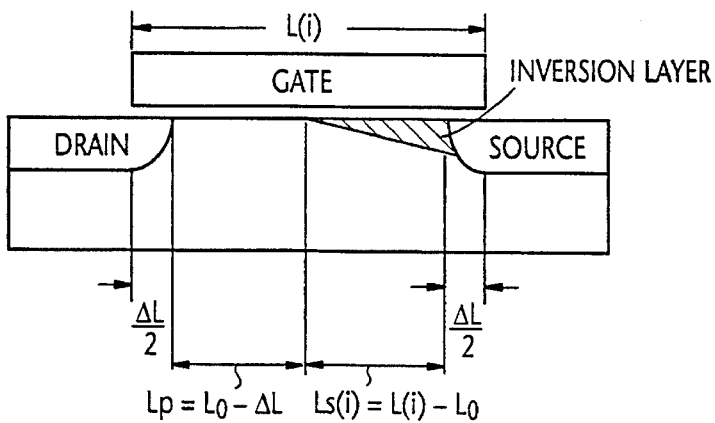
FIG. 5 is a schematic illustration of a MISFET model.

As shown in FIG. 5 in which a MISFET device model is schematically represented, the length Lp of the pinch-off region is equal to $L_0-\Delta L$ and the source-to-pinch-off point distance Ls(i) for device 5-i is represented by $L(i)-L_0$.

Figure 6A:
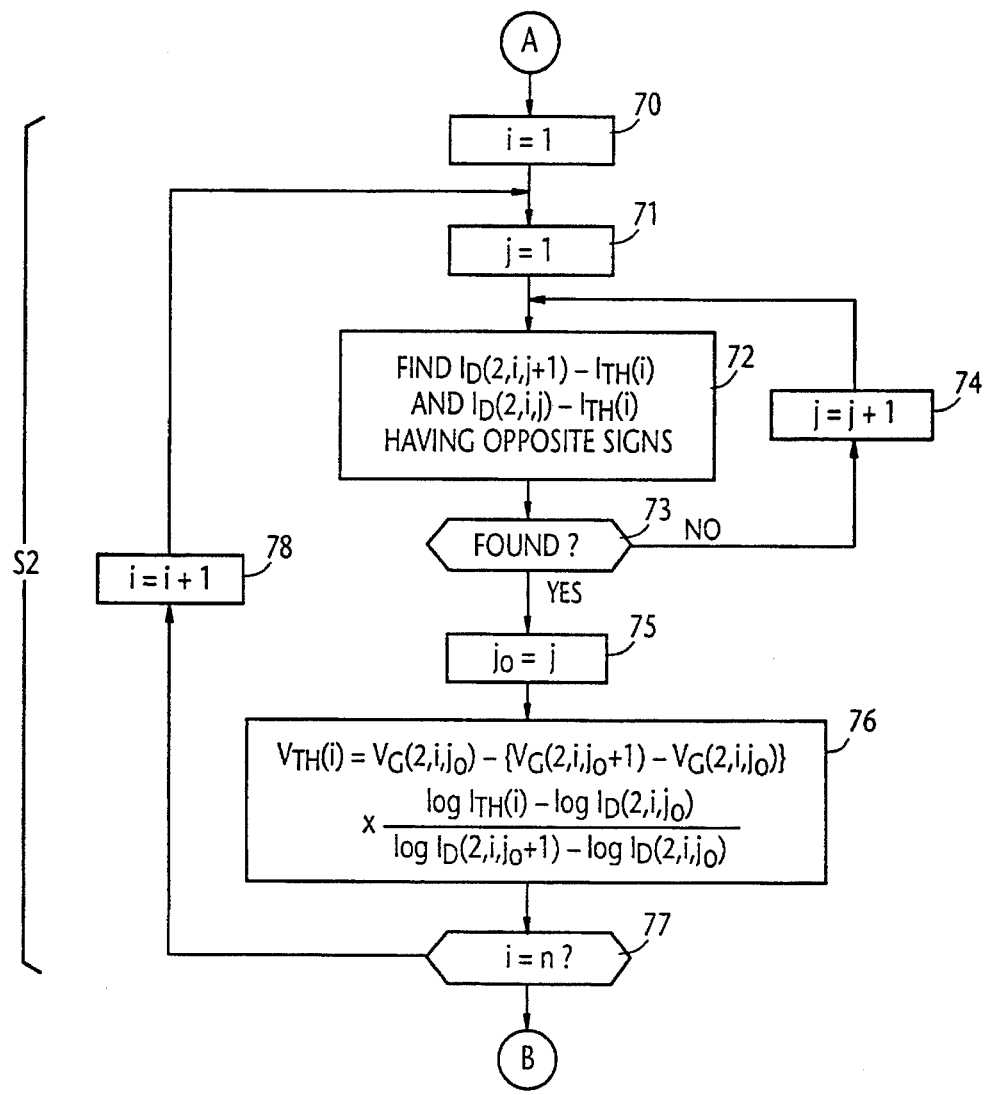
FIGS. 6A and 6B are flowcharts of modified embodiments of the present invention.
Figure 6B:
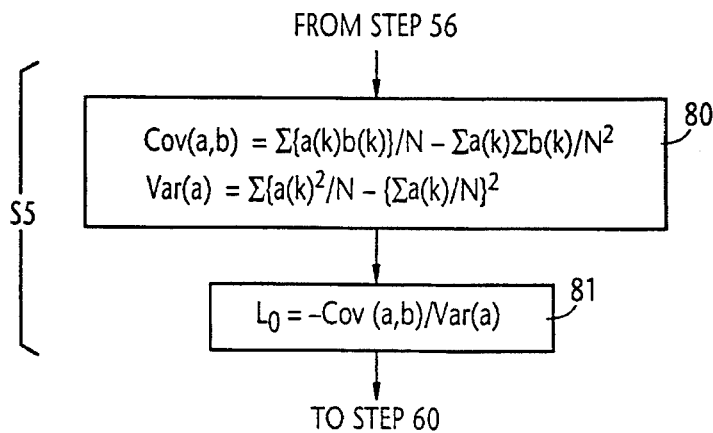

Modifications of the subroutines S2 and S5 are shown in FIGS. 6A and 6B, respectively. The modified subroutine S2 involves steps for searching through the gate voltages $V_G(2,i,j)$ which are used with the drain voltage of 3.5 volts for a value which would be generated when the drain current $I_D$ attains a predetermined threshold value $I_{TH}$ using an exponential interpolation technique.

In FIG. 6A, subroutine S2 begins with steps 70 and 71 by successively setting indices i and j to 1. At step 72, $I_D(2,i,j+1)-I_{TH}(i)$ and $I_D(2,i,j)-I_{TH}(i)$ are calculated and a search is made through the calculated values for a pair of those having opposite signs. Steps 72, 73 and 74 are repeated until a pair of values having opposite signs are found at step 73. Control advances to step 75 to set the index j of the opposite signs to $j_o$. The following Equation is calculated at step 76 to derive a threshold gate voltage of exponentially interpolated value:

$$V_{TH}(i) = V_G(2,i,j_o) + \{V_G(2, i,j_o + 1) - V_G(2,i,j_o)\} \times \frac{\log I_{TH}(i) - \log I_D(2,i,j_o)}{\log I_D(2,i,j_o + 1) - \log I_D(2,i,j_o)} \quad (15)$$

By executing steps 77 and 78, steps 71 to 76 are repeated to compute Equation (15) for all MISFET devices.

The modified subroutine S5 involves the use of a statistical averaging method to determine a coordinate point $L_0$ that corresponds to the intersection of the regression lines. As illustrated in FIG. 6B, the following Equations are computed at step 70:

$$Cov(a,b) = \Sigma\{a(k)b(k)\}/N - \Sigma a(k)\Sigma b(k)/N^2 \quad (16)$$

$$Var(a) = \Sigma\{a(k)^2\}/N - \{\Sigma a(k)/N\}^2 \quad (17)$$

where Σ is a summation from k=1 to k=N. Using the results obtained at step 80, the coordinate point $L_0$ is determined as follows (step 81):

$$L_0 = -Cov(a,b)/Var(a) \quad (18)$$

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A device for extracting, from a plurality of metal-insulator-semiconductor field effect transistors (MISFET) a universal difference between gate length and effective channel length, comprising:

means for selectively and successively applying, for a predetermined drain voltage, a set of gate voltages $V_G(i,j)$ at a predetermined voltage increment within a given voltage range to each of said plurality of MISFET devices;

means for measuring a set of drain currents $I_D(i,j)$ corresponding to said set of gate voltages $V_G(i,j)$ from each of said plurality of MISFET devices, said MISFET devices respectively having a particular gate length L(i), wherein i identifies each of the MISFET devices and j is an integer;

means for interpolating a set of drain currents $I_D(i,k)$ from the measured drain currents $I_D(i,j)$ such that the interpolated drain currents correspond respectively to predetermined ones of voltage differences $V_G(i,j)-V_{TH}(i)$, where k is an integer and $V_{TH}(i)$ is a threshold voltage of each of said MISFET devices;

means for producing a set of regression lines R(k)= a(k)L(i)+b(k) in a coordinate space from a set of relationships between $V(k)/I_D(i,k)$ and said particular gate lengths $L(i)$, where $a(k)$ and $b(k)$ are constants, where $V(k)$ represents said predetermined ones of voltage differences;

means for determining from said constants $a(k)$ and $b(k)$ a coordinate point of the coordinate space corresponding to an intersection of said regression lines; and means for generating, from said coordinate point, said universal difference between gate length and effective channel length.

2. A device as claimed in claim 1, further comprising means for determining the threshold voltage $V_{TH}(i)$ from the measured drain currents $I_D(i,j)$ and said gate voltages $V_G(i,j)$.

3. A device for extracting, from a plurality of metal-insulator-semiconductor field effect transistors (MISFET) a universal difference between gate length and effective channel length, comprising:

means for selectively and successively applying, for a predetermined low drain voltage, a set of gate voltages $V_G(i,j)$ at a predetermined voltage increment within a given voltage range to each of said plurality of MISFET devices;

means for measuring a first set of drain currents $I_D(i,j)$ corresponding to said set of gate voltages $V_G(i,j)$ from each of said plurality of MISFET devices;

means for selectively and successively applying, for a predetermined high drain voltage, said set of gate voltages $V_G(i,j)$ at said predetermined voltage increment and within said given voltage range to each of said plurality of MISFET devices;

means for measuring a second set of drain currents $I_D(i,j)$ corresponding to said set of gate voltages $V_G(i,j)$, said MISFET devices respectively having a particular gate length $L(i)$, where i identifies each of the MISFET devices and j is an integer;

means for determining a set of threshold voltages $V_{TH}(i)$ from the first set of drain currents $I_D(i,j)$ and said gate voltages $V_G(i,j)$;

means for interpolating a set of drain currents $I_D(i,k)$ from the second set of drain currents $I_D(i,j)$ such that the interpolated drain currents correspond respectively to predetermined ones of voltage differences $V_G(i,j)-V_{TH}(i)$, where k is an integer;

means for deriving a set of regression lines $R(k)=a(k)L(i)+b(k)$ from a set of relationships between $V(k)/I_D(i,k)$ and said particular gate lengths $(L(i)$, where $a(k)$ and $b(k)$ are constants, where $V(k)$ represents said predetermined ones of voltage differences;

means for determining from said constants $a(k)$ and $b(k)$ a coordinate point corresponding to an intersection of said regression lines; and means for generating, from said coordinate point, said universal difference between gate length and effective channel length.

4. A device for extracting, from a plurality of metal-insulator-semiconductor field effect transistors (MISFET) a universal difference between gate length and effective channel length, comprising:

means for selectively and successively applying, for a predetermined drain voltage, a set of gate voltages $V_G(i,j)$ at a predetermined voltage increment within a given voltage range to each of said plurality of MISFET devices;

input means for entering said particular gate lengths $L(i)$; and processing means for interpolating a set of drain currents $I_D(i,k)$ from the measured drain currents $I_D(i,j)$ such that the interpolated drain currents correspond respectively to predetermined ones of voltage differences $V_G(i,j)-V_{TH}(i)$, producing a set of regression lines $R(k)=a(k)L(i)+b(k)$ in a coordinate space from a set of relationships between $V(k)/I_D(i,k)$ and the particular gate lengths $L(i)$ from said input means, said processor further comprising means for determining from said constants $a(k)$ and $b(k)$ a coordinate point of the coordinate space corresponding to an intersection of said regression lines, where $a(k)$ and $b(k)$ are constants, k is an integer, $V_{TH}(i)$ is a threshold voltage of each of said MISFET devices, and $V(k)$ represents said predetermined ones of voltage differences, said processor further comprising means for generating, from said coordinate point, said universal difference between gate length and effective channel length.

5. A device as claimed in claim 4, wherein said processor means further comprises means for determining said threshold voltage $V_{TH}(i)$ from the measured drain currents $I_D(i,j)$ and said gate voltages $V_G(i,j)$.

6. A device as claimed in claim 4, wherein said processor means further comprises means for determining a set of differences between said particular gate lengths $L(i)$ and said coordinate point, further comprising output means for receiving values representative of the set of said differences from the processor means.

7. A device for extracting, from a plurality of metal-insulator-semiconductor field effect transistors (MISFET) a universal difference between gate length and effective channel length, comprising:

means for selectively and successively applying, for a predetermined low drain voltage, a set of gate voltages $V_G(i,j)$ at a predetermined voltage increment within a given voltage range to each of said plurality of MISFET devices;

means for measuring a first set of drain currents $I_D(i,j)$ corresponding to said set of gate voltages $V_G(i,j)$ from each of said plurality of MISFET devices;

means for selectively and successively applying, for a predetermined high drain voltage, said set of gate voltages $V_G(i,j)$ at said predetermined voltage increment and within said given voltage range to each of said plurality of MISFET devices;

means for measuring a second set of drain currents $I_D(i,j)$ corresponding to said set of gate voltages $V_G(i,j)$, said MISFET devices respectively having a particular gate length $L(i)$, where i identifies each of the MISFET devices and j is an integer;

input means for entering said particular gate lengths $L(i)$; and processor means for determining a set of threshold voltages $V_{TH}(i)$ from the first set of drain currents $I_D(i,j)$ and said gate voltages $V_G(i,j)$, interpolating a set of drain currents $I_D(i,k)$ from the second set of drain currents $I_D(i,j)$ such that the interpolated drain currents correspond respectively to predetermined ones of voltage differences $V_G(i,j)-V_{TH}(i)$, deriving a set of regression lines $R(k)=a(k)L(i)+b(k)$ from a set of relationships between $V(k)/I_D(i,k)$ and the particular gate lengths $L(i)$ from the input means, and determining from said constants $a(k)$ and $b(k)$ a coordinate point corresponding to an intersection of said regression lines, where k is an integer, $a(k)$ and $b(k)$ are constants, and $V(k)$ represents said predetermined ones of voltage differences, said processor further comprising means for generating, from said coordinate point, said universal difference between gate length and effective channel length.

* * * * *